United States Patent [19]

Schmoock

[11] Patent Number: 4,465,538
[45] Date of Patent: Aug. 14, 1984

[54] METHOD OF MAKING A PRINTED CIRCUIT BOARD

[76] Inventor: Helmuth Schmoock, Buchener Weg 121, D-2058 Lauenburg/Elbe, Fed. Rep. of Germany

[21] Appl. No.: 350,107

[22] Filed: Feb. 18, 1982

Related U.S. Application Data

[63] Continuation-in-part of Ser. No. 289,385, Aug. 3, 1981, abandoned.

[30] Foreign Application Priority Data

Aug. 4, 1980 [DE] Fed. Rep. of Germany ....... 3029521

[51] Int. Cl.³ .......................... B05D 5/12; H05K 3/18
[52] U.S. Cl. ...................................... 156/233; 29/846; 156/234; 156/237; 156/241; 156/249; 339/17 B; 339/17 T; 427/96; 427/261; 427/265; 427/304; 427/305; 427/306; 428/209; 428/901; 428/914
[58] Field of Search ............... 156/233, 234, 237, 238, 156/240, 241, 235, 249, 277; 427/96, 258, 261, 287, 265, 304–306; 428/209, 901, 913, 914; 29/846; 174/68.5; 339/17 B, 17 T

[56] References Cited

U.S. PATENT DOCUMENTS

| | | | |
|---|---|---|---|
| 3,080,270 | 3/1963 | Lorenz | 428/209 |
| 3,235,395 | 2/1966 | Scharf | 428/209 |
| 3,615,980 | 10/1971 | Schuck et al. | 428/209 |

Primary Examiner—Bruce H. Hess
Attorney, Agent, or Firm—Peter K. Kontler

[57] ABSTRACT

Adhesive is applied to a substrate for a printed circuit board in a pattern corresponding to that of the printed circuit. If the adhesive is of the type which contains a solvent, the substrate and adhesive are heated after application of the latter in order to drive off the solvent. Subsequently, a thin foil of a material which is capable of bonding to a chemically deposited metal is pressed onto the adhesive. The adhesive is then permitted to set which causes those portions of the foil in contact with the adhesive to adhere tightly to the latter. Once the adhesive has set, the foil is peeled from the adhesive. The portions of the foil which contact the adhesive remain bound to the adhesive thereby forming a base which is capable of receiving a chemically deposited metal. The thus-coated substrate is immersed in a bath where an electrically conductive metal for forming the printed circuit is chemically deposited in a pattern corresponding to that of the adhesive and, consequently, of the printed circuit.

25 Claims, 5 Drawing Figures

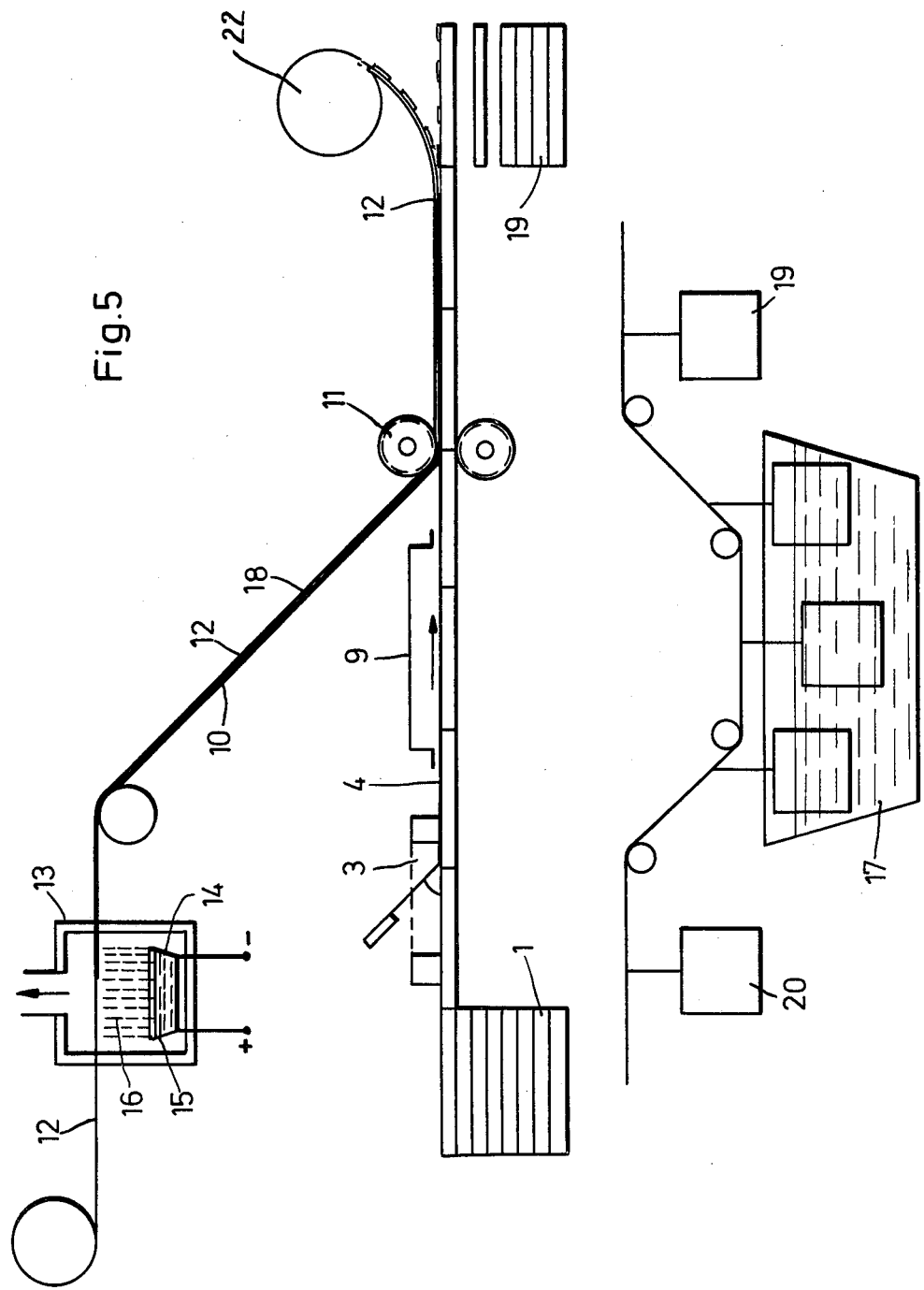

METHOD OF MAKING A PRINTED CIRCUIT BOARD

BACKGROUND OF THE INVENTION

This is a continuation-in-part of abandoned application. Ser. No. 289,385 filed Aug. 3, 1981.

The invention relates to printed circuit boards and methods of making the same.

Printed circuit boards are manufactured in various ways. In the additive technique, a mixture consisting of palladium and an adhesive, e.g. acrylonitrile, butadiene or a phenolic-based adhesive, and palladium is secured to an aluminum foil or carrier. The mixture may be pressed or poured onto the aluminum foil or may be applied by immersing the latter in the adhesive. The coating thus produced on the aluminum foil constitutes a catalytic core on which copper may be deposited to form a printed circuit.

The mixture is dried at a temperature of 140° C. This is followed by cutting and drilling of the composite consisting of aluminum foil and catalytic core. Subsequently, the catalytic core is etched in a mixture of chromic and sulfuric acids in order to cause separation of the palladium to the surface of the catalytic core. This may be achieved by passing the catalytic core through a bath constituted by such a mixture. The silk-screen process is then used to selectively apply to the palladium a substance which prevents the deposition of copper. The areas of the palladium which are coated with this substance cannot be copper plated whereas the remaining, exposed areas of the palladium are capable of receiving a copper coating. The exposed areas of the palladium are arranged in a pattern corresponding to the desired pattern of the printed circuit, that is, the silk-screen process defines the contours of the printed circuit. Once the silk-screen process has been completed, copper is deposited on the exposed areas of the palladium either chemically or galvanically.

In another method, a substrate is coated with a copper foil. The silk-screen process is used to selectively apply to the copper foil a substance which is resistant to etching solutions capable of removing copper. The areas of the copper foil which are coated with this substance are thus protected against such etching solutions. These areas of the copper foil are arranged in a pattern corresponding to the desired pattern of the printed circuit. After completion of the silk-screen process, the copper foil is etched to remove the exposed areas thereof.

The methods used heretofore for the production of printed circuit boards require relatively complicated and expensive procedures as well as large amounts of material and labor. The production of a catalytic core, in particular, constitutes a very costly step. Moreover, the known methods for the production of printed circuit boards contribute greatly to environmental pollution.

OBJECTS AND SUMMARY OF THE INVENTION

It is an object of the invention to provide a printed circuit board and method of making the same which enable costs to be reduced.

Another object of the invention is to provide a printed circuit board and method of making the same which enable environmental pollution to be reduced.

An additional object of the invention is to provide a printed circuit board and method of making the same which enable material and labor requirements to be reduced.

It is also an object of the invention to so improve upon the methods described above that printed circuits may be formed without a catalytic core such as in the prior art and without complicated etching procedures. In this manner, the price of printed circuit boards is to be substantially reduced.

Still another object of the invention is to so improve upon the methods described above that even small numbers of printed circuit boards may be produced with high precision at low cost.

The preceding objects, and others which will become apparent as the description proceeds, are achieved by the invention.

According to the invention, a printed circuit board having a printed circuit of a predetermined pattern includes a substrate. The substrate carries an adhesive layer which conforms to the pattern of the printed circuit and an electrically conductive layer constituting the printed circuit is provided on the adhesive layer.

The electrically conductive layer has a thickness sufficient to carry the current which is supplied to the printed circuit board.

In accordance with one embodiment of the invention, a base layer is bonded to the adhesive layer and the electrically conductive layer is, in turn, bonded to the base layer. The electrically conductive layer may be chemically deposited on the base layer.

The adhesive layer is advantageously substantially free of solvent when the base layer is applied thereto.

The substrate which receives the adhesive layer is preferably non-conductive.

The invention further provides a method of making a printed circuit board having a printed circuit of a predetermined pattern. The method involves applying an adhesive layer to a substrate in conformance with the pattern and coating the adhesive layer with an electrically conductive layer which constitutes the printed circuit.

In a preferred embodiment of the method, the adhesive layer is pressed onto a non-conductive substrate in accordance with the predetermined pattern of the printed circuit and the solvent present in the adhesive layer, if any, is removed therefrom. A foil composed of a material which is capable of bonding to a chemically deposited, electrically conductive substance is pressed onto the adhesive layer after removal of the solvent but before the adhesive layer has set or hardened. Once the adhesive layer has set, the foil is peeled away in such a manner that the portions of the foil corresponding to the pattern of the printed circuit and the adhesive layer remain on the latter. The portions of the foil which remain bound to the adhesive layer constitute a base or base layer for the electrically conductive layer. The electrically conductive layer, which is advantageously metallic, is subsequently chemically deposited on the base layer in a predetermined thickness sufficient to carry the current which is supplied to the circuit board.

As indicated above, any solvent present in the adhesive layer is preferably removed before the base layer is applied to the adhesive layer. The reason is that the base layer and the electrically conductive layer hinder escape of the solvent from the adhesive layer once these have been applied to the latter. The solvent may then form gas pockets in the adhesive layer. When soldering operations are performed on the printed circuit board, the heat from such operations is transmitted along the electrically conductive layer or printed circuit. The heat raises the temperature of the gas in the gas pockets thereby causing the gas to expand. The expansion of the gas may result in a pressure increase internally of the gas pockets which is sufficient to loosen the base layer and electrically conductive layer from the adhesive layer. The printed circuit board may then not function properly.

The only pretreatment which the substrate requires is a degreasing. The minimum distance of separation between the conducting strips of the printed circuit, as well as the finesse of the conducting strips, are determined by the particular manner in which the adhesive layer is applied to the substrate.

The base layer, which is preferably capable of being chemically metallized to thereby function as an agent via which chemical metallization of the adhesive layer is effected, may be deposited in very precise thicknesses. The base layer may be very thin (100–400 Angstroms) so that only small amounts of material are required to produce the same. This makes it possible to form the base layer from expensive materials such as, for example, noble metals and rare earths which enable good deposits of the electrically conductive layer to be achieved.

The invention does not require the substrate to be provided with a catalytic core such as in the prior art or to be etched. Rather, only those areas corresponding to the electrically conductive layer or the conducting strips of the printed circuit are coated with a layer which is capable of being chemically metallized and forms the base for the electrically conductive layer to be deposited by chemical means. The electrically conductive layer may be made of any metal which can be deposited via chemical metallization, e.g. copper. Accordingly, the base layer may be deposited on the adhesive layer as convenient and the metal for the electrically conductive layer matched to the base layer. A printed circuit board manufactured in accordance with the invention is inexpensive as regards bioth the manufacturing operations and the basic materials to be used.

The novel features which are considered as characteristic of the invention are set forth in particular in the appended claims. The improved printed circuit board itself, however, both as to its construction and its mode of manufacture, together with additional features and advantages thereof, will be best understood upon perusal of the following detailed description of certain specific embodiments with reference to the accompanying drawing.

BRIEF DESCRIPTION OF THE DRAWING

FIG. 5 schematically illustrates an apparatus for manufacturing printed circuit boards in accordance with the invention.

DESCRIPTION OF THE PREFERRED EMBODIMENTS

Figure 1:
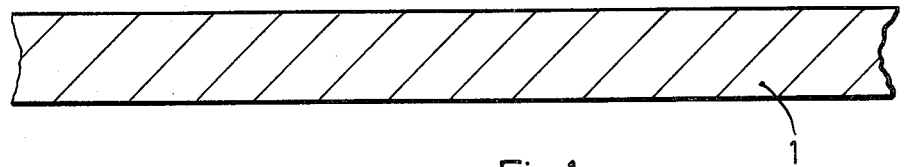
FIG. 1 is a cross section through a degreased substrate.

FIG. 1 illustrates a substrate 1 which is to be provided with electrically conductive strips or paths forming the printed circuit of a printed circuit board. The substrate 1 has been degreased in a known and non-illustrated manner.

As seen in FIG. 5, which schematically illustrates an apparatus advantageously used for carrying out the method of the invention, the substrate 1 is placed in a non-illustrated supply vessel together with other, similar substrates. In the illustrated embodiment, the substrate 1 and the other substrates are assumed to be in the form of individual sheets or wafers and are arranged in a stack. However, it is also possible for the substrate 1 and the other substrates to be supplied from a roll.

Figure 2:
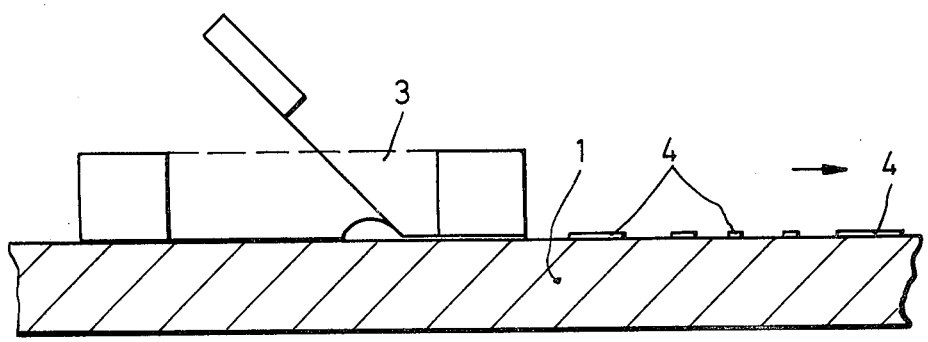
FIG. 2 is a cross section through the substrate of FIG. 1 illustrating the application of an adhesive layer to the substrate.

Referring to FIGS. 2 and 5, the substrate 1 is conveyed from the stack to a printing station 3 where a layer 4 of adhesive is applied to or imprinted upon the substrate 1. The adhesive layer 4 is applied to the substrate 1 in a pattern which corresponds to that of the printed circuit to be formed on the substrate 1. In other words, the adhesive layer 4 is not applied to the substrate 1 uniformly but only in those areas where the conducting strips of the printed circuit are to be located. The adhesive layer 4 may be applied to the substrate 1 by means of the silk-screen process or the intaglio process. The silk-screen process has the advantage that the adhesive layer 4 may be produced more readily and cheaply.

The adhesive used for the adhesive layer 4 will generally be of the type which yields a dry tack. For the reason outlined earlier, the adhesive layer 4 should be dry or free of solvent at the time the next layer of the printed circuit board is applied thereto. As seen in FIG. 5, a drying station 9 for careful drying of the adhesive layer 4 is located downstream of the printing station 3. All of the solvent contained in the adhesive layer 4 is driven out of the same in the drying station 9.

Figure 3:
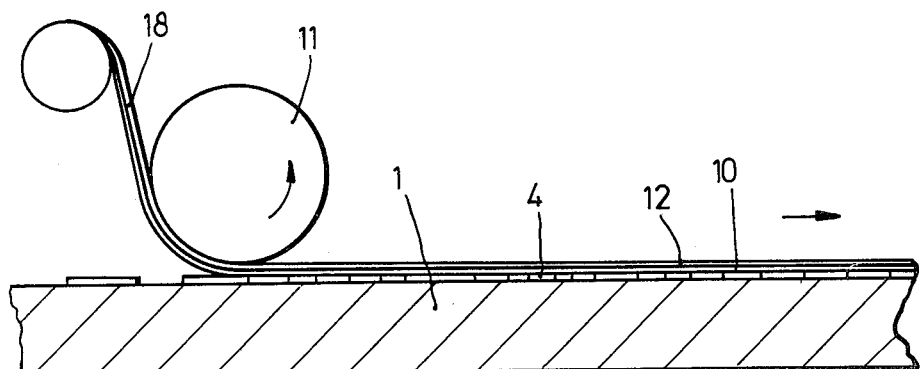
FIG. 3 is a cross section through the substrate of FIG. 2 showing the application of a foil of a base metal to the adhesive layer of the substrate.

Instead of using a solvent-containing adhesive for the adhesive layer 4, it is possible to use an adhesive which contains no solvent. In such an event, the drying station 9 may be omitted After leaving the drying station 9, the adhesive layer 4, which is now free of solvent, is brought into contact with a strip 18 consisting of a carrier 12 and a metallic foil 10. This is shown in FIGS. 3 and 5. As best seen in FIG. 5, the strip 18 is produced by passing the carrier 12 through a vapor deposition station 13 in which the metallic foil 10 is vapor-deposited on the carrier 12. The carrier 12 is in the form of a band and is conveyed through the vapor deposition station 13 by a driven take-up reel 22 which unwinds the carrier 12 from a supply reel 21. The vapor deposition station 13 accommodates a metallic bath 15 and a heating unit 14. A vacuum is maintained in the vapor deposition station 13 as indicated by the arrow. The heating unit 14 heats the metallic bath 15 to such a high temperature that metallic vapor 16 is released by the bath 15 and, under the influence of the vacuum, travels upwards towards the carrier 12 and is deposited on the latter.

Referring again to FIG. 3 in conjunction with FIG. 5, the metallic foil 10 of the strip 18 is pressed against the adhesive layer 4 by a pair of rolls 11. The rolls 11 press the metallic foil 10 against the adhesive layer 4 in such a manner that the metallic foil 10 adheres to the adhesive layer 4 at all locations where the metallic foil 10 and the adhesive layer 4 come into contact. The rolls 11 may be heated in order to achieve adhesion between the metallic foil 10 and the adhesive layer 4.

After being compressed by the rolls 11, the adhesive layer 4 sets or hardens while in engagement with the strip 18. Once the adhesive layer 4 has set, the metallic foil 10 firmly adheres to the adhesive layer 4. The adhesion between the metallic foil 10 and the adhesive layer 4 is so great that, when the carrier 12 is peeled away, the portions of the metallic foil 10 which adhere to the adhesive layer 4 remain bound to the latter. The adhesion between the metallic foil 10 and the adhesive layer 4 is much greater than the cohesion between the metallic foil 10 and the carrier 12. It is only along the adhesive layer 4 that portions of the metallic foil 10 continue to adhere to the substrate 1 upon removal of the carrier 12. The edges of those portions of the metallic foil 10 which remain on the adhesive layer 4 are well-defined.

Figure 4:
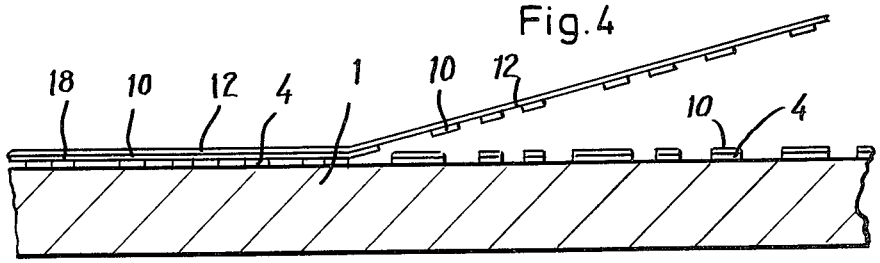
FIG. 4 is a cross section through the substrate of FIG. 3 illustrating the removal of those portions of the foil which do not adhere to the adhesive layer of the substrate.

Subsequent to setting of the adhesive layer 4, the carrier 12 may be readily removed from the substrate 1. As illustrated in FIG. 4, those portions of the metallic foil 10 which do not contact the adhesive layer 4 continue to adhere to the carrier 12 when this is peeled away from the substrate 1.

After removal of the carrier 12, a pretreated board 19 is obtained as shown in FIG. 5. The adhesive layer 4 of the pretreated board 19 has a metallic coating which is constituted by the portions of the metallic foil 10 left behind upon removal of the carrier 12. This coating forms a base layer capable of bonding to a chemically deposited, electrically conductive metal. As illustrated in FIG. 5, the pretreated board 19 is conveyed through a bath 17 in which a layer of an electrically conductive metal, e.g. copper, is chemically deposited on the base layer and bonded thereto. The chemical metallization which occurs in the bath 17 takes place in a known manner. The electrically conductive layer of the finished printed circuit board 20 emerging from the bath 17 has a thickness which is adjusted to the magnitude of the electrical current to be supplied to the printed circuit board 20.

The substrate 1 may be a sheet, e.g. a non-woven sheet, of phenolic resin. The substrate 1 may also be a web, a woven sheet, a non-woven sheet or a paper sheet which has been impregnated with a phenolic resin. For example, the substrate 1 may be an epoxy web, a woven epoxy sheet, a non-woven epoxy sheet or an epoxy paper sheet which has been impregnated with a phenolic resin. Phenolic resins which may be used include a product marketed under the trademark Super-Pertinax by the Dielektra company of the Federal Republic of Germany and a product marketed under the trademark Trolytax by the Troisdorf company of the Federal Republic of Germany. The substrate 1 may further be a paper sheet which has been impregnated with a phenol.

Melamine resins have also been found suitable for the substrate 1. A satisfactory melamine resin is one marketed under the trademark Trolytax by the Troisdorf company. It is to be noted that various resins are marketed under the trademark Trolytax by the Troisdorf company and that these are distinguished from one another by different manufacturer identification numbers.

Other materials which may be used for the substrate 1 are polyesters, polyimides, polycarbonates and polysulfones. It is further possible to make the substrate 1 from an inexpensive paper such as transformer paper which has been coated, laminated or impregnated with a polyester, a polyimide, a polycarbonate or a polysulfone. Suitable polyesters include a product marketed under the trademark Hostaphan by the Hochst and Kalle companies of the Federal Republic of Germany, a product marketed under the trademark Melinex by ICI and a product marketed under the trademark Mylar by Dupont. A satisfactory polyimide is one marketed under the trademark Kapton by Dupont. Polycarbonates are available from General Electric as well as from the Bayer and Lonza companies of the Federal Republic of Germany which market a polycarbonate under the trademark Makrolon. A suitable polysulfone is a product marketed under the trademark Udell by Union Carbide.

The adhesive layer 4 may be produced from a reactive resin composition, that is, a resin composition which exhibits physical and chemical reactivity. Compositions of this type include multicomponent systems such as isocyanate-containing resins and hardenable epoxy resins. The isocyanate-containing resins are examplified by the hardenable polyurethanes. The latter, as well as the epoxy resins, constitute examples of adhesives which do not contain a solvent. Suitable polyurethanes include the products marketed under the trademarks Desmodur and Desmophen by the Bayer company of the Federal Republic of Germany. Epoxy resins which may be used include those which are based on fatty acid amides and harden or polymerize when brought into contact with a product marketed under the trademark Versamid. A satisfactory epoxy resin is one marketed under the trademark Epikote by Shell.

The adhesive layer 4 may also be formed from reactive resin compositions which are hardenable under the influence of atmospheric moisture. Such compositions are exemplified by polyethers having stable terminal NCO groups. A suitable polyether is that marketed under the trademark Desmophen by the Bayer company of the Federal Republic of Germany.

Reactive resin compositions which harden or polymerize under the influence of electron beam radiation or under the influence of ultraviolet light may likewise be used for the adhesive layer 4. Acrylic resins are exemplary of such compositions. Acrylic resins which are capable of setting when subjected to electron beam radiation or ultraviolet light are marketed by the Rohm & Haas company of the Federal Republic of Germany. It is further possible to form the adhesive layer 4 from an acrylic resin which hardens or polymerizes when heated.

The base layer which is obtained from the metallic foil 10 and is capable of being chemically metallized may be composed of a non-ferrous metal such as, for example, copper or nickel. The base layer may also be composed of a noble metal, especially gold or silver. In addition, elements of the rare earth group which are capable of being chemically metallized may be used for the base layer. For instance, the base layer may be formed of cerium. It is to be understood that the base layer need not be constituted by a metal but may be composed of any substance which is capable of bonding to a chemically deposited metal.

The carrier 12 may be provided with a parting layer prior to vapor deposition of the material which is to form the metallic foil 10. The purpose of the parting layer is to facilitate disengagement of the carrier 12 and those portions of the metallic foil 10 which remain on the adhesive layer 4 and form the base layer. The parting layer must be such that it does not adhere to the base layer under any circumstances. Thus, the base layer must be absolutely clean so that the metallization in the metallizing bath 17 takes place without difficulty.

The parting layer may consist of wax which is firmly secured to the carrier 12. A suitable wax is one marketed under the trademark E-Wax by the BASF company of the Federal Republic of Germany.

It is further possible for the parting layer to be composed of a silicone which firmly adheres to the carrier 12. The Wacker Chemie company of the Federal Republic of Germany manufactures a product which is identified as silicone and is satisfactorily used for the parting layer.

A parting lacquer or varnish which releases more readily from the base layer than from the carrier 12 may likewise be utilized for the parting layer. Lacquers or varnishes which may be used include those which are based on salts of acrylic acid. Suitable lacquers or varnishes are exemplified by the product marketed under the trademark ZEIN by the Maizena company of the Federal Republic of Germany. Another product is marketed by the Rohm & Haas company of the Federal Republic of Germany, under the trademark Rohagit.

Appropriate selection of the material of the carrier 12 is advantageous. Materials which may be used for the carrier 12 include polypropylenes, polyesters and polycarbonates. A suitable polypropylene is one marketed under the trademark Propafan by the Hochst company of the Federal Republic of Germany. The latter company, as well as the Kalle company of the Federal Republic of Germany, also market a satisfactory polyester under the trademark Hostaphan. Other satisfactory polyesters are a product marketed under the trademark Mylar as well as a product marketed under the trademark Melinex by ICI. A suitable polycarbonate is marketed under the trademark Makrolon by the Bayer and Lonza companies of the Federal Republic of Germany.

The coating of the adhesive layer 4 with a base layer which is capable of bonding to a chemically deposited metal may also be achieved by means of the known sputtering process.

The following Example, which is not to be construed as limiting the invention, illustrates the method of the invention:

EXAMPLE

A substrate 1 is conveyed to the printing station 3 where an adhesive layer 4 is applied to the substrate 1 in a pattern corresponding to that of the printed circuit to be formed on the substrate 1. The adhesive used for the adhesive layer 4 contains a solvent and the substrate 1 travels to the drying station 9 where the solvent is evaporated from the adhesive layer 4. The drying station 9 is maintained at a temperature in the range of 80°–120° C. After passing through the drying station 9, the substrate 1 is conveyed to the rolls 11 where a metallic foil 10 supported by a carrier 12 is pressed against the adhesive layer 4.

The metallic foil 10 is vapor-deposited on the carrier 12 in the vapor deposition station 13. The latter contains a metallic bath 15 which is heated to a temperature of 1450° C. A vacuum in the range of $10^{-4}$–$5 \times 10^{-4}$ torr is maintained in the vapor deposition station 13 so that metallic vapor released from the bath 15 travels to and is deposited on the carrier 12 which is conveyed through the vapor deposition station 13 above the bath 15.

The rolls 11 are heated to a temperature in the range of 100°–110° C. The adhesive layer 4, which has not yet set when the substrate 1 reaches the rolls 11, hardens in contact with the metallic foil 10. The metallic foil 10 thus firmly adheres to the adhesive layer 4. Once the adhesive layer 4 has set, the carrier 12 is peeled away from the substrate 1. The portions of the metallic foil 10 which overlie the areas of the substrate 1 to be provided with the printed circuit, and which accordingly contact the adhesive layer 4, remain on the latter as the carrier 12 is peeled away from the substrate 1. On the other hand, the remaining portions of the metallic foil 10 are peeled away from the substrate 1 together with the carrier 12.

The pretreated board 19 obtained after the carrier 12 has been peeled away from the substrate 1 is conveyed through a bath 17 where an electrically conductive metal is chemically deposited on the portions of the metallic foil 10 remaining on the adhesive layer 4. For making a copper layer, the bath 17 contains sodium hydroxide at a concentration of 3.75 grams per liter, sodium-potassium tartrate at a concentration of 25 grams per liter, 10 milliliters of a formalin solution containing 35–40% formaldehyde and copper sulfate ($CuSO_4$) at a concentration of 3.6 grams per liter. The bath 17 has a pH of about 12.8 and is maintained at a temperature in the range of 21°–24° C. The pretreated board 19 moves through the bath 17 at a velocity of about 1.5–3 meters per second and remains in the bath 17 for approximately one-half hour. The printed circuit board 20 obtained upon removal of the pretreated board 19 from the bath 17 has a printed circuit constituted by the electrically conductive metal deposited on the pretreated board 19 in the bath 17.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning the range of equivalence of the appended claims.

I claim:

1. A method of making a circuit board having a circuit of a predetermined pattern, said method comprising the steps of:
   (a) applying an adhesive layer to a circuit board substrate in said predetermined pattern;
   (b) adhering a base layer to said adhesive layer; and
   (c) forming said circuit subsequent to the adhering step by coating said base layer with an electrically conductive layer.

2. The method of claim 1, wherein said adhesive layer includes a solvent; and further comprising the step of removing said solvent from said adhesive layer prior to the adhering step.

3. The method of claim 1, said base layer being capable of bonding to a chemically deposited metallic coating; and wherein the forming step comprises chemically depositing said electrically conductive layer on said base layer.

4. The method of claim 1, wherein the adhering step comprises contacting said adhesive layer with a foil and thereafter disengaging said foil from said adhesive layer in such a manner that the portions of said foil corresponding to said pattern remain secured to said adhesive layer.

5. The method of claim 4, further comprising the step of vapor-depositing said foil on a carrier prior to the adhering step; and wherein the disengaging step comprises peeling said carrier from said adhesive layer.

6. The method of claim 5, further comprising the step of applying a parting layer to said carrier prior to the vapor-depositing step, said parting layer adhering to said carrier subsequent to the disengaging step.

7. The method of claim 6, wherein said parting layer comprises a wax, a silicone or a lacquer.

8. The method of claim 5, wherein said carrier comprises a polypropylene, a polyester or a polycarbonate.

9. The method of claim 4, further comprising the step of hardening said adhesive layer prior to the disengaging step.

10. The method of claim 9, said circuit board being designed for a predetermined electrical current, and said electrically conductive layer being metallic and coated in a thickness sufficient to carry the current, said substrate being substantially non-conductive; and wherein said adhesive layer includes a solvent and said solvent is removed from said adhesive layer prior to the adhering step, the forming step comprising chemically depositing said electrically conductive layer on said base layer.

11. The method of claim 1, wherein said adhesive layer is substantially free of solvent when said base layer is applied thereto.

12. The method of claim 1, wherein said electrically conductive layer is metallic.

13. The method of claim 1, wherein said substrate is substantially non-conductive.

14. The method of claim 1, wherein the applying step is performed using the silk-screen process.

15. The method of claim 1, wherein the applying step is performed using an intaglio process.

16. The method of claim 1, wherein said adhesive layer is substantially free of solvent prior to the forming step.

17. The method of claim 1, wherein said base layer is substantially free of coatings incapable of firmly bonding to said electrically conductive layer upon initiation of the forming step.

18. A method of making a circuit board having a circuit of a predetermined pattern, said method comprising the steps of:

(a) applying an adhesive layer to a substantially non-conductive circuit board substrate in said predetermined pattern;

(b) applying a foil to a carrier, said foil being capable of firmly bonding to an electrically conductive material;

(c) bonding said foil to said adhesive layer, said adhesive layer being substantially free of solvent prior to the bonding step;

(d) removing said carrier subsequent to the bonding step so that the portions of said foil in contact with said adhesive layer remain secured to the latter while at least the major part of the remainder of said foil is removed with said carrier; and (e) forming said circuit by coating said portions of said foil with said electrically conductive material.

19. The method of claim 18, wherein said electrically conductive material is a metal.

20. The method of claim 18, wherein the forming step comprises chemically depositing said electrically conductive material on said portions of said foil.

21. The method of claim 18, wherein said adhesive layer comprises a solvent upon being applied to said substrate; and further comprising the step of removing said solvent from said adhesive layer prior to the bonding step.

22. The method of claim 18, wherein the bonding step comprises pressing said foil against said adhesive layer.

23. The method of claim 18, wherein said adhesive layer is printed onto said substrate.

24. The method of claim 18, wherein the bonding step comprises hardening said adhesive layer while said foil contacts the same.

25. The method of claim 18, wherein said portions of said foil are substantially free of coatings incapable of firmly bonding to said electrically conductive material upon initiation of the forming step.

* * * * *